United States Patent [19]
Suleski

[11] Patent Number: 6,027,595
[45] Date of Patent: Feb. 22, 2000

[54] METHOD OF MAKING OPTICAL REPLICAS BY STAMPING IN PHOTORESIST AND REPLICAS FORMED THEREBY

[75] Inventor: Thomas J. Suleski, Charlotte, N.C.

[73] Assignee: Samsung Electronics Co., Ltd., Suwon, Rep. of Korea

[21] Appl. No.: 09/109,914

[22] Filed: Jul. 2, 1998

[51] Int. Cl.[7] .............................. B44C 1/165; B44C 1/22; B32B 31/00; B41M 3/12
[52] U.S. Cl. ..................... 156/230; 156/232; 156/240; 156/247; 156/289; 427/152; 216/41
[58] Field of Search .................... 156/230, 231, 156/232, 233, 234, 240, 241, 247, 289; 427/152; 216/41

[56] References Cited

U.S. PATENT DOCUMENTS

| | | | |
|---|---|---|---|
| 4,482,511 | 11/1984 | Komatsubara | 264/22 |
| 4,983,459 | 1/1991 | Franz et al. | 428/410 |
| 5,512,131 | 4/1996 | Kumar et al. | |
| 5,575,878 | 11/1996 | Cox et al. | |

OTHER PUBLICATIONS

Philippe Nussbaum et al., "Simple technique for replication of micro–optical elements" Optical Engineering, vol. 37 No. 6, Jun. 1998, pp. 1804–1807.

Xiao–Mei Zhao et al., "Fabrication of Three–Dimensional Micro–Structures: Microtransfer Molding" Adv. Mater Jan. 1996 pp. 837–840.

Younan Xia et al., "Complex Optical Surfaces Formed by Replica Molding Against Elastomeric Masters" Science, vol. 273, Jul. 19, 1996, pp. 347–349.

George M. Whitesides et al., "Replica molding: Complex optics at lower costs" Photonics Spectra, Jan. 1997, pp. 90–91.

Xiao–Mei Zhao et al., "Demonstration of waveguide couplers fabricated using microtransfer molding" Appl. Phys. Lett., vol. 71, No. 8, Aug. 25, 1997.

Enoch Kim et al., "Polymer microstructures formed by moulding in capillaries" Nature, vol. 376, Aug. 17, 1995, pp. 581–584.

*Primary Examiner*—Mark A. Osele
*Assistant Examiner*—J. A. Lorengo
*Attorney, Agent, or Firm*—Jones Volentine, L.L.P.

[57] ABSTRACT

Optical structures are replicated in photoresist on a substrate using a stamp. The transfer of the pattern into the liquid photoresist and the provision on the substrate can be achieved using manual pressures. Various techniques may be used to remove air from the liquid photoresist. The stamp is removed once the liquid photoresist is fully solidified. These structures in solidified photoresist may serve as optical elements or may be accurately transferred into the substrate. The stamp may be for an entire wafer.

28 Claims, 3 Drawing Sheets

METHOD OF MAKING OPTICAL REPLICAS BY STAMPING IN PHOTORESIST AND REPLICAS FORMED THEREBY

BACKGROUND OF THE INVENTION

1. Field of the Invention

The present invention is directed to a method of making optical replicas by stamping in liquid photoresist and the replicas formed thereby. The stamped photoresist may be used to further transfer the pattern into the substrate through photolithographic processes.

2. Description of Related Art

Replication is a key factor to achieving affordable, mass produced optical elements. Replication is particularly of interest for micro-optical elements and for diffractive optical elements having multiple discrete levels, for which many masks are needed to create such elements photolithographically.

One known replication method is disclosed in U.S. Pat. No. 5,279,689 entitled "Method for Replicating Holographic Elements," which is hereby incorporated by reference in its entirety. In the '689 patent, a layer of embossable material is formed on a substrate. Then a stamper is positioned on the layer and pressed into the surface of the layer. The layer is then cured and the stamper removed, thereby forming the holographic optical element. However, this layer is subject to shifting on and peeling from the substrate.

An attempt to address the problems of the '689 patent is disclosed in U.S. Pat. No. 5,575,878 entitled "Method for Making Surface Relief Profilers," which is hereby incorporated by reference in its entirety. In the '878 patent, a dry photopolymer layer is applied to a glass substrate having a thin layer of polymethylmethacrylate (PMMA) thereon. The dry photopolymer layer is then stamped with a glass master to create the desired pattern therein. The dry photopolymer layer is then cured and then the pattern therein is transferred to the glass substrate by dry etching. In the '878 patent, the PMMA layer is used as an adhesion promoter on the glass substrate so that the dry photopolymer layer will adhere to the substrate, while allowing the glass master to be lifted therefrom.

However, several problems still exist with either method. First, the photopolymer disclosed in the '878 patent degrades during etching, particularly during the faster etching processes, most likely at least in part due to high temperatures in the etching chamber. Therefore, the pattern may not be accurately transferred to the substrate. When trying to create multiple elements simultaneously on a wafer level, while the PMMA helps the dry photopolymer layer adhere, due to the increased surface area of the wafer, part of the dry photopolymer layer may still be pulled away from the substrate, resulting in inaccurate transfer of the pattern. If the photopolymer layer itself was to serve as the relief structure on either a glass or a plastic substrate, as in the '689 patent, even with the PMMA layer, when trying to create multiple elements simultaneously on a wafer level, the stresses resulting when dicing the wafer result in the photopolymer layer peeling or shifting from the substrate even during creation. Finally, the use of the dry photopolymer requires high pressures to be applied in order to transfer the pattern into the dry photopolymer.

SUMMARY OF THE INVENTION

The present invention is therefore directed to a method of creating optical replicas and the replicas made thereby which substantially overcomes one or more of the problems due to the limitations and disadvantages of the related art.

It is an object of the present invention to replicate structures in photoresist. It is a further object of the present invention to create replicated structures on a wafer level.

These and other objects may be realized by a method of making an optical replica including contacting liquid photoresist with a stamp having a pattern therein, thereby replicating the pattern in the photoresist, providing the liquid photoresist on a substrate opposite a side of the liquid photoresist contacting the stamp, solidifying the liquid photoresist; and removing the stamp from solidified photoresist. The providing may include applying the liquid photoresist on the substrate and the contacting may include stamping the liquid photoresist with the stamp. Alternatively, the contacting may include applying the liquid photoresist on the stamp and the providing may include pressing the liquid photoresist and the substrate together.

The pattern in the solidified photoresist may be transferred into the substrate. The substrate may be a glass substrate, including silicon. The transferring may include anisotropic etching the pattern in the solidified photoresist into the glass substrate. The substrate may be a wafer. The wafer may be diced after the stamp is removed. The stamp may be a wafer. The stamp may be made of an elastomeric, polymeric material, which may be molded to form the pattern therein. The elastomeric, polymeric material may be polydimethylsiloxane. Alternatively, the stamp may be made of glass which is treated with a release agent, e.g., a fluorinated trichlorosilane, before contacting the liquid photoresist. At least part of the solidifying may occur before the liquid photoresist is provided on the substrate.

The method may further include removing air bubbles from the liquid photoresist. Such removal may include contacting the substrate with the stamp having the liquid photoresist thereon at an angle to allow the air to escape while the substrate is brought into contact. When the liquid photoresist is provided on the substrate, such removal may include, when using an elastomeric, polymeric material for the stamp, bowing the stamp such that the stamp contacts the liquid photoresist first in the center and then pressing out to the edges to allow the air to escape through the edges or may include tightly clamping one side of the stamp to the substrate, loosely clamping the other side of the stamp to the substrate, and tightening the loose clamp until tight, allowing the air to escape out of the loosely clamped side. Such air removal is particularly advantageous when replicating optics on a larger scale, such as on a wafer level.

These and other objects are further realized by an optical replica made in accordance with any of the above methods.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above and other object, features and advantages of the present invention will become readily apparent to those skilled in the art from the detailed description which follows and from the accompanying drawings, in which.

DETAILED DESCRIPTION OF PREFERRED EMBODIMENTS

Figure 1:
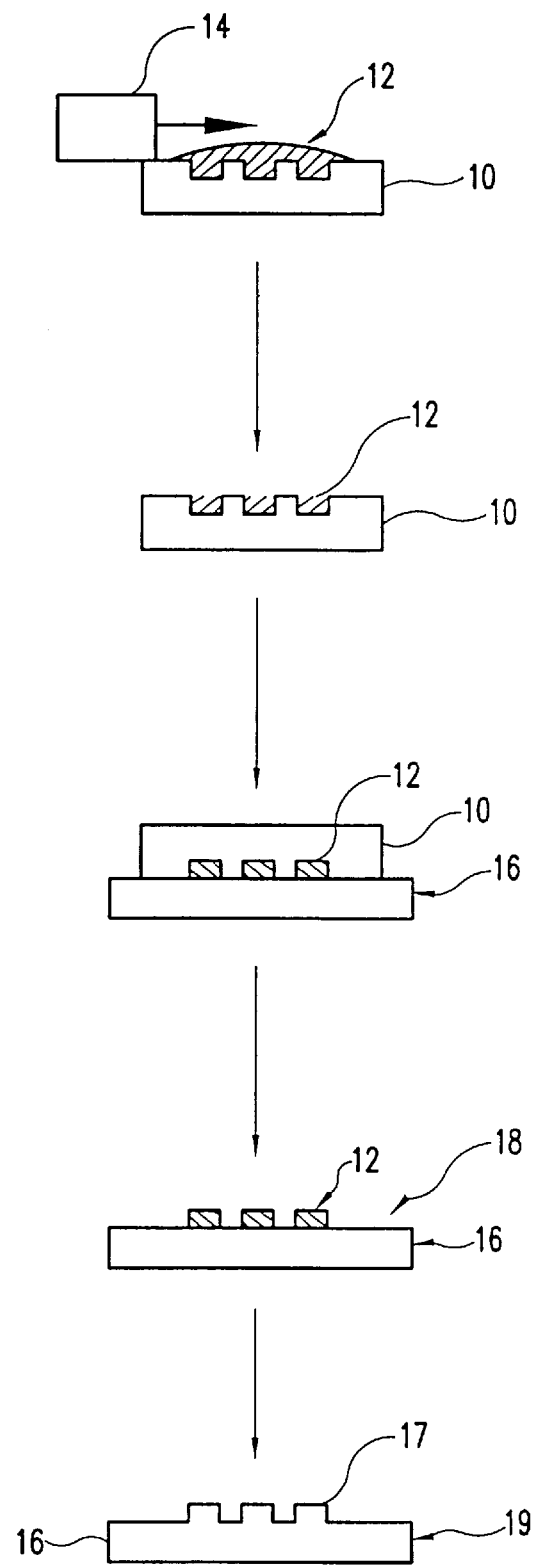
FIG. 1 shows schematic illustrations of the replication process in accordance with the present invention using photoresist and etching the pattern into the substrate.

While the present invention is described herein with reference to illustrative embodiments for particular applications, it should be understood that the present invention is not limited thereto. Those having ordinary skill in the art and access to the teachings provided herein will recognize additional modifications, applications, and embodiments within the scope thereof and additional fields in which the invention would be of significant utility without undue experimentation.

Typically when attempting to replicate an element, the materials examined for use in the replicating process are those specifically designed for such replication. However, the present invention is based on the requirement that the replicated structure be accurately transferred into a glass substrate. As used herein, the term "glass" is to include glass, silica, fused quartz, and other inorganic substances, such as Si, GaAs, that have good optical properties and are durable.

With the emphasis being on the accurate transfer of the pattern into the substrate, particularly when creating structures having small features and large aspect ratios requiring the use of anisotropic techniques, including fast etching processes such as inductively coupled plasma etching, the present invention involves first determining materials suitable for use with such techniques. Therefore, the present invention is directed to selecting liquid photoresist as a suitable material for use with such techniques and determining how to replicate in liquid photoresist. As used herein, the term "photoresist" is to include liquid photopolymers which, after solidification, allow a high fidelity transfer into a substrate by etching.

One reason photoresist is so advantageous is that while transfer of a pattern into a substrate may be conceptually easy, in practice it is difficult to achieve with high fidelity. There has been much work conducted regarding the control of photoresist when using photoresist to transfer a pattern into a substrate. For example, while the respective etch rates of the material having the pattern and the substrate may not theororetically matter as long as they are known, in practice the relative etch rates of these materials needs to be comparable, e.g., a ratio between approximately 0.5 and 2. If the substrate has an etch rate which is much slower than the etch rate of the patterned material, the aspect ratios of the pattern will have to be much bigger and the patterned material much thicker. The large aspect ratio is difficult to make and the thicker the material, the lower the resolution. If the substrate has an etch rate which is much faster than the etch rate of the patterned material, any lack of uniform thickness or other imperfection will be amplified in the transfer of the pattern.

The use of photoresist for transferring a pattern into a substrate is sufficiently understood that the above noted parameters can be controlled to allow the accurate transfer of the pattern. It is known how to make photoresist sufficiently maintain its shape throughout the etching process. Therefore, the present invention is directed to determining how to replicate in photoresist to obtain all the attendant advantages of both replication and the use of photoresist, particularly for transferring a pattern therein into a substrate.

In a preferred embodiment, the replicating of the present invention is based on the discovery that elastomeric, polymeric materials do not stick to liquid photoresist, either before or after curing. Elastomeric, polymeric materials are elastic enough to closely conform to even small features, e.g., sub-micron, but not so elastic as to deform when pressed against a stamping surface with unacceptable fidelity for many applications. In particular, there are a variety of suitable elastomeric polymeric materials, especially silicone polymers, epoxy polymers, and acrylate polymers. A preferred material within the silicone polymers is polydimethylsiloxane (PDMS). PDMS does not adhere to liquid photoresist, either before or after curing of the liquid photoresist.

The use of elastomeric, polymeric materials, in particular PDMS, generally in replicating optical elements is disclosed in U.S. Pat. No. 5,512,131 entitled "Formation of Microstamped Patterns on Surfaces and Derivative Articles" which is hereby incorporated by reference in its entirety. The '131 patent discloses forming lenses by molding elastomeric, polymeric material and using the resultant element made of PDMS as the lens. The '131 patent also discloses forming a diffraction grating by micromachining the elastomeric, polymeric material and using this as the diffraction grating itself or as a stamp to create diffraction gratings on other materials.

The stamping process in the '131 patent involves applying a self-assembled monolayer (SAM) to a PDMS stamp and coating a substrate with metal. Upon stamping the metal on the substrate with the PDMS stamp, the non-recessed portions of the PDMS stamp will transfer the SAM to the metal. This SAM serves as a "mask" such that portions of the metal not covered by the SAM are further processed. While this processing may include etching, the SAM only serves as a blocking mask, so any degrading thereof does not affect the final product as long as it covers the appropriate portions. Thus, the pattern itself is not transferred into the substrate.

The '131 patent fails to teach that the elastomeric, polymeric materials set forth therein freely release from liquid photoresist. The embossable materials typically employed in both the '131 patent and other related art are sub-optimal for use during anisotropic etching.

The present invention, by recognizing that the elastomeric, polymeric materials, in addition to having suitable deformation characteristics recognized in the '131 patent, have the further advantageous property of being extremely easy to release from liquid photoresist. Thus, in accordance with the present invention, photoresist can be used as a replication material using, for example, elastomeric, polymeric materials, in particular PDMS, as a master element to transfer a pattern therein to the liquid photoresist.

The desired pattern may be transferred to the PDMS by molding with a master, e.g., a glass master or a master having microstructures in photoresist, on which the desired pattern has been generated, typically photolithographically. For example, PDMS, which is a mixture of two liquids, the silicone elastomer and a curing agent, is poured over an optical element master. The PDMS will cure over time at room temperature, but heat may be used to speed up the curing process. When the PDMS stamp is formed by molding with a glass master, a release agent such as a fluorinated trichlorosilane release agent, e.g., (tridecafluoro-1,1,2,2-tetrahydro-octyl)-1-trichlorosilane can be used to allow easy separation of the glass and the PDMS. Alternatively, the desired pattern may be micromachined into the elastomeric, polymeric material to form the stamp.

While PDMS is useful for many applications, there is concern that the flexible nature of the PDMS may introduce distortions to the pattern. When extremely high precision is required, the glass master itself may serve as the stamp, preferably with the use of a release agent, preferably a fluorinated tricholorosilane release agent noted above. Obviously, such a pattern on a glass stamp would be the negative of the desired pattern.

The following description sets forth different examples of manners in which a stamp may be used to replicate optical elements in photoresist. While a simple binary element is shown as being replicated in one example and a grating is replicated in another example, it is to be understood that any optical element, including refractives, refractive/diffractive hybrids, diffractives having multiple discrete levels, diffractives having continuous contours etc., could be replicated in accordance with any of the methods the present invention. Any photolithographic techniques, including gray scale masks and reflow of photoresist, may be used to generate a master which is used as a mold to form the stamp or to generate the stamp itself.

Further, while the creation of a single optical element is illustrated in the following examples, it is to be understood that the present invention is particularly advantageous when creating multiple optical elements simultaneously on a wafer level, and the master may be a wafer master, not just a single element master. Finally, while the substrate is shown as being planar in the figures, it is to be understood that when using the elastomeric, polymeric master, the substrate could also have a non-planar surface, such as a lens.

The following reference to "positive" and "negative" photoresist is different from that in conventional lithography where a photoresist is masked, exposed and developed. In contrast, in the present invention, the role of the liquid photoresist is to serve as a material that can be molded into the desired shape or pattern. The distinction between positive and negative photoresist for the stamping application of the present invention is in terms of how the photoresist, which is stamped when in liquid form, is cured or solidified. For a positive photoresist, the liquid photoresist is solidified by a thermal process, e.g., baking, or by other appropriate processes, such as electron bombardment, depending on the exact material used. Examples of positive photoresist which can be used with the present invention include SHIPLEY 3813, SHIPLEY 1400 series, AZ 5209. For a negative photoresist, the liquid photoresist is solidified by exposure to ultraviolet light. Examples of negative photoresist which can be used with the present invention include FUTURREX NR8. A further difference between these types of photoresist is that the positive photoresist needs an adhesion promoter to stick to the glass substrate, while a negative photoresist does not. The solidifying of both types of liquid photoresist and the adhesion promoter for the positive photoresist are all conventional.

As shown in FIG. 1, a layer of uncured photoresist 12 is applied to an embossing stamp 10. Excess photoresist 12 is removed from the embossing stamp 10 using, for example, a block 14 of, for example, PDMS. The embossing stamp 10 filled with the photoresist 12 is brought into contact with a substrate 16. Manual pressure alone is sufficient to achieve this contact. With the embossing stamp 10 still in place, the photoresist 12 is cured by, for example, exposure to actinic radiation, when the photoresist 12 is a negative photoresist, or by thermal processes when the photoresist 12 is a positive photoresist, such curing being known to those of skill in the art. The radiation, if used, can be delivered through either the embossing stamp 10 or the substrate 16.

After the photoresist 12 is cured, the embossing stamp 10 is removed, leaving the negative of the pattern in the embossing stamp 10 transferred in the photoresist 12 on the substrate 16. For some applications, a replica 18 formed by the patterned photoresist 12 on the substrate 16 may serve as the final optical element itself. When the replica 18 is the end product, the substrate material is not important as long as photoresist adheres to it. Optics made and used directly in photoresist are less expensive to produce than elements which transfer the pattern in the photoresist into glass, since the transfer process is eliminated. However, photoresist optics have many of the same problems as plastic optics, i.e., are more susceptible to abrasion, thermal effects, chemical effects, and laser damage than glass optics.

Preferably, the patterned photoresist 12 is then transferred into the substrate 16 made of glass in a conventional manner, for example, using anisotropic etching, such as reactive ion etching (RIE), chemically assisted ion beam etching (CAIBE), inductively coupled plasma etching, and ion milling. This transfer may include hard baking the photoresist depending on the transfer process used. This transfer of the pattern from the photoresist 12 to the substrate 16 results in a replica 19, in which the substrate 16 has a patterned surface 17.

Figure 2:
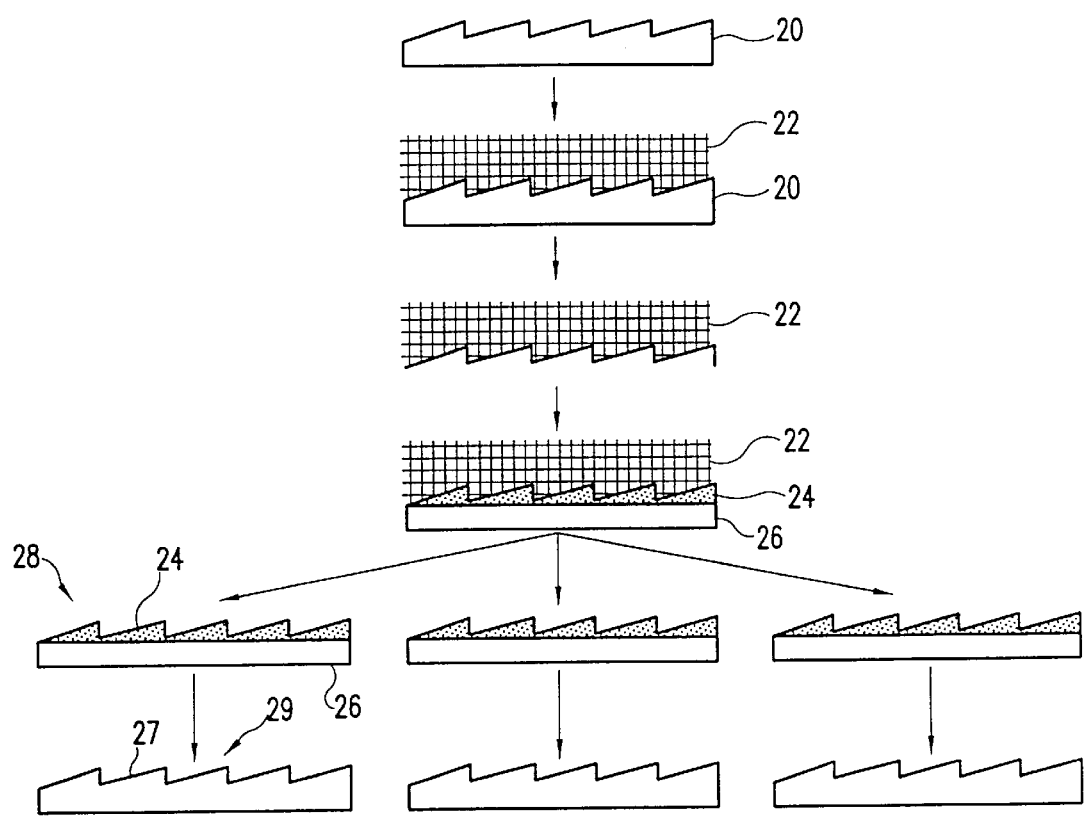
FIG. 2 shows schematic illustrations of the replication process, including an embodiment for forming the stamp, in accordance with another embodiment of the present invention using photoresist and etching the pattern into the substrate to form multiple replicas from the same stamp.

An alternate method is shown in FIG. 2, in which a blazed grating is formed. A glass master 20 having the pattern to be transferred to a substrate receives an elastomeric, polymeric material thereon. When the elastomeric, polymeric material is removed from the glass master 20, it is ready to serve as the embossing stamp 22. The photoresist 24 may either be applied to the embossing stamp 22 or to a substrate 26. The embossing stamp 22 is brought into contact with the substrate 26, thereby casting the photoresist against the substrate. As before, sufficient contact may be realized by manual pressure.

As discussed above in connection with FIG. 1, the photoresist is then fully cured and the stamp 22 is removed to form an optical element 28 by the patterned photoresist on a substrate may serve as the final optical element itself. When the replica 28 is the end product, the substrate material is not important as long as photoresist adheres to it.

Preferably, the pattern in the photoresist 24 may be transferred into the glass substrate 26 in a conventional manner, for example, using anisotropic etching. This transfer of the pattern from the photoresist layer 24 to the glass substrate 26 results in the replica 29 in which the glass substrate 26 has a patterned surface 27. As shown in FIG. 2, a single embossing stamp may be used numerous times to form the same element as the original glass master 20. When the glass master 20 itself is to serve as the embossing stamp, the pattern therein will obviously be a negative of the one to be transferred to the substrate.

As noted above, the use of the elastomeric, polymeric master or a glass stamp treated with a release agent allows photoresist to be patterned and then cured on a glass substrate, while easily removing the master, i.e., removal such that the pattern in the photoresist layer and the photoresist layer/glass substrate bond are not affected. This patterned photoresist may then be transferred to the glass substrate in known manners, or the replica consisting of the patterned photoresist on a substrate may be used as the optical element itself.

Figure 3A:
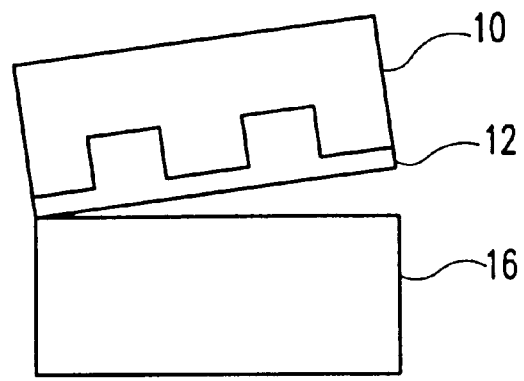
FIGS. 3A–3C illustrates three methods for removing air from a liquid photoresist prior to solidification.

Each of the manners of providing the liquid photoresist having the pattern therein to the substrate discussed above has its advantages. The application of the photoresist to the stamp reduces problems with air bubbles which may arise when pressing the stamp into a photoresist layer. As shown in FIG. 3A, when the photoresist 12 is applied to the stamp 10, the stamp 10 may contact the substrate 16 at an angle to allow air bubbles in the liquid photoresist to escape as the remainder of the stamp 10 having the photoresist 12 is brought into contact. Further, the application of the photoresist to the stamp allows the photoresist to be at least partially cured or solidified before bringing it into contact with the substrate. This solidification allows gases which are released during solidification to escape, avoiding attendant gas trapping problems associated therewith.

Figure 3B:
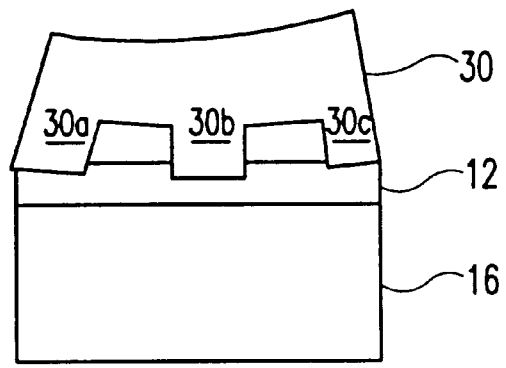
Figure 3C:
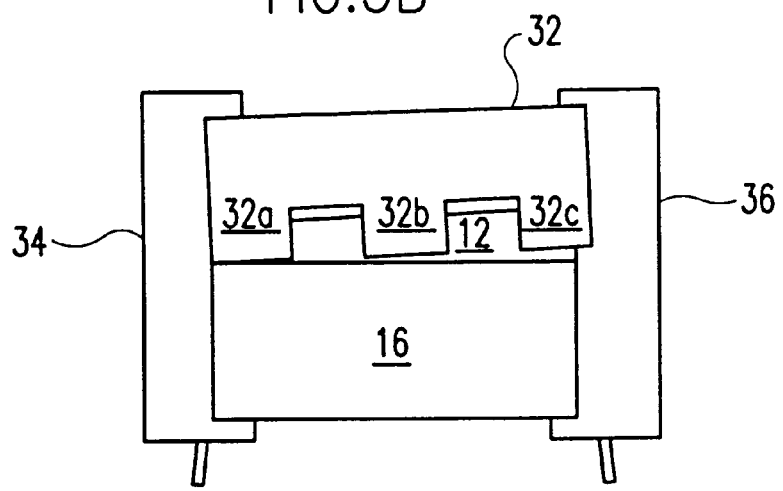

However, it is difficult to control the thickness of the photoresist 12 when applied to the stamp 10. Since it is often desirable for the photoresist 12 to be as thin a layer as possible while still receiving the pattern, it can be advantageous to provide the photoresist 12 on the substrate 16, as shown in FIGS. 3B and 3C. Thicker layers of photoresist result in much longer etching times, leading to increased expense, increased likelihood that the patterned material will degrade due to the increased exposure to the etching process, and increased inaccuracies due to deviations in etch rate across the element. The thickness of the photoresist provided on the substrate 16 can be accurately controlled in a conventional manner.

When a stamp 30 is made of an elastomeric, polymeric material, it is flexible. Therefore, such a flexible stamp 30 may be bowed to allow a central portion 30b thereof to stamp the photoresist 12 first, and then release to allow outer portions 30a, 30c to stamp the photoresist 12. Any air in the photoresist 12 is thus allowed to escape from the periphery as the stamp 30 is brought into full contact with the photoresist 12.

Alternatively, when a stamp 32 is made of any material, adjustable clamps 34, 36 clamping the stamp 32 to the substrate 16 may be used for allowing a differential in contact amount across the stamp, thereby allowing the air to escape where the stamp is not yet in contact with the substrate. For example, the clamp 34 may be tightly clamped so as to provide full contact of an outer portion 32a of the stamp 32 while the clamp 36 may be loosely clamped to allow air to escape from the photoresist. The clamp 36 is tightened to provide full contact of both the middle portion 32b and the opposite outer portion 32c, while allowing air to escape until full contact is achieved.

The removal of air from the photoresist is of particular importance when making larger components, including forming a plurality of elements on a wafer level. Any of the above techniques may be used with wafer stamps and wafer substrates.

A further problem arises when replicating on a wafer level when dicing a wafer containing such elements into individual portions, which may contain one or more optical elements. The photoresist serving as the optical element itself can withstand the dicing stresses and remain adhered to the substrate better than previous replication materials. Further, if the pattern in the photoresist is transferred into the substrate, this adherence is no longer a problem. However, dicing is still a messy process. The dirty by-products of the dicing stick to photoresist and are difficult to remove. If only dicing a single wafer, the wafer could be flipped over and covered with a material which seals elements so that when the dicing slurry is used, it does not contact the elements. Alternately, another wafer, with or without further optical elements, could be bonded to the wafer containing the stamped photoresist features such that a seal is formed between the wafers around each individual portion to be diced. Such sealing is disclosed in commonly assigned, co-pending U.S. application Ser. No. 08/943,274 entitled "Wafer Level Integration of Multiple Optical Elements" filed Oct. 3, 1997, which is hereby incorporated by reference in its entirety. This sealing would keep the photoresist clean during dicing.

In accordance with the present invention, a desired pattern is replicated in photoresist. This replication may be achieved using an elastomeric, polymeric stamp or a glass stamp treated with a release agent. Such a stamp easily releases from the photoresist. The pattern may then be easily transferred into a substrate, or the photoresist may serve as the optical element itself. Such replication, either with or without transferring to a substrate, may conveniently be used to reproduce multiple optical elements on a wafer level. Such wafer level replication may be performed using a wafer stamp.

Although preferred embodiments of the present invention have been described in detail herein above, it should be clearly understood that many variations and/or modifications of the basic inventive concepts herein taught, which may appear to those skilled in the art, will still fall within the spirit and scope of the present invention as defined in the appended claims and their equivalents.

What is claimed is:

1. A method of making an optical replica comprising:
   contacting liquid photoresist with a stamp having a pattern therein, thereby replicating the pattern in the photoresist;
   providing the liquid photoresist on a substrate opposite a side of the liquid photoresist contacting the stamp;
   solidifying the liquid photoresist;
   removing the stamp; and
   simultaneously etching solidified photoresist and the substrate.

2. The method of claim 1, wherein said providing includes applying the liquid photoresist on the substrate and said contacting includes stamping the liquid photoresist with the stamp.

3. The method of claim 1, wherein said contacting includes applying the liquid photoresist on the stamp and said providing includes pressing the liquid photoresist and the substrate together.

4. The method of claim 1, further comprising transferring the pattern in the solidified photoresist into the substrate.

5. The method of claim 1, wherein the substrate is a glass substrate.

6. The method of claim 5, wherein the glass substrate is a silicon substrate.

7. The method of claim 5, wherein said simultaneous etching includes anisotropic etching of the pattern in the solidified photoresist into the glass substrate.

8. The method of claim 1, wherein the substrate is a wafer.

9. The method of claim 8, further comprising dicing the substrate after said removing.

10. The method of claim 8, wherein the stamp is a wafer.

11. The method of claim 1, wherein the stamp is made of an elastomeric, polymeric material.

12. The method of claim 11, further comprising, before said contacting, molding the elastomeric, polymeric material to form the pattern therein.

13. The method of claim 11, wherein the elastomeric, polymeric material is polydimethylsiloxane.

14. The method of claim 1, further comprising, when the stamp is made of glass, treating the stamp with a release agent before said contacting.

15. The method of claim 14, wherein the release agent is a fluorinated trichlorosilane.

16. The method of claim 3, wherein at least part of said solidifying occurs before said pressing.

17. The method of claim 3, wherein said pressing includes introducing the liquid photoresist at an angle to the substrate.

18. The method of claim 2, wherein said contacting includes applying differential initial stamping to the photoresist across the stamp.

19. The method of claim 18, wherein, when the stamp is flexible, said applying differential initial stamping includes bending the stamp.

20. The method of claim 18, wherein said applying differential initial stamping includes clamping one portion of the stamp more tightly than another portion of the stamp.

21. An optical replica made in accordance with the method of claim 1.

22. The method of claim 1, further comprising:
   determining a required thickness of the solidified photoresist to achieve a desired optical profile in accordance with relative etch rates of the solidified photoresist and the substrate; and
   providing the liquid photoresist in accordance with the required thickness.

23. The method of claim 1, wherein said simultaneous etching substantially removes all of the solidified photoresist.

24. The method of claim 1, wherein the pattern includes more than two levels.

25. The method of claim 24, wherein the levels are discrete levels.

26. The method of claim 24, wherein the levels have a continuous profile.

27. The method of claim 1, wherein said simultaneously etching includes transferring a surface topology of the solidified photoresist into the substrate.

28. The method of claim 27, wherein said transferring is in a ratio between 0.5 and 2 in accordance with respective etch rates of the solidified photoresist and the substrate.

* * * * *

UNITED STATES PATENT AND TRADEMARK OFFICE
CERTIFICATE OF CORRECTION

PATENT NO.    : 6,027,595
DATED         : February 22, 2000
INVENTOR(S)   : Thomas J. Suleski Page 1 of 1

It is certified that error appears in the above-identified patent and that said Letters Patent is hereby corrected as shown below:

On the title page item [75] and [73] should read as follows:

Inventors: Thomas J. Suleski, Michael R. Feldman, Brian Harden,
           all of Charlotte, N.C.

Assignee: Digital Optics Corporation, Charlotte, N.C.

Column 1,
After the title, please insert --This invention was made with Government support under N00014-98-C-0039 awarded by the U.S. Office of Naval Research. The U.S. Government may have certain rights in this invention.--

Signed and Sealed this

Nineteenth Day of June, 2001

Attest:

NICHOLAS P. GODICI
Attesting Officer
Acting Director of the United States Patent and Trademark Office